United States Patent [19]
Parker

[11] Patent Number: 5,980,702
[45] Date of Patent: Nov. 9, 1999

[54] SPUTTERING APPARATUS FOR IMPROVED STEP COVERAGE

[75] Inventor: Norman William Parker, Fairfield, Calif.

[73] Assignee: Applied Materials, Inc., Santa Clara, Calif.

[21] Appl. No.: 08/889,714

[22] Filed: Jul. 8, 1997

Related U.S. Application Data

[63] Continuation of application No. 08/561,148, Nov. 21, 1995, abandoned, which is a continuation of application No. 08/241,057, May 11, 1994, abandoned.

[51] Int. Cl.$^6$ .................................................. C23C 14/34
[52] U.S. Cl. ................................ 204/192.12; 204/298.11
[58] Field of Search .......................... 204/192.12, 298.11, 204/298.19

[56] References Cited

U.S. PATENT DOCUMENTS

| | | | |
|---|---|---|---|
| 4,508,612 | 4/1985 | Blackwell et al. | 204/298.11 |
| 4,704,306 | 11/1987 | Nakamura | 204/298.11 X |
| 4,988,424 | 1/1991 | Woodward et al. | 204/192.12 |
| 5,223,108 | 6/1993 | Hurwitt | 204/192.12 |
| 5,344,352 | 9/1994 | Horne et al. | 204/192.15 |
| 5,643,428 | 7/1997 | Krivokapic et al. | 204/192.12 |

FOREIGN PATENT DOCUMENTS

| | | |
|---|---|---|
| 0 154 859 | 9/1985 | European Pat. Off. . |
| 0 474 348 | 3/1992 | European Pat. Off. . |

OTHER PUBLICATIONS

IBM Technical Disclosure Bulletin, Anonymous "Improvement of Uniformity of Through—Hole Coverage", vol. 30, No. 4, Sep. 1987.

*Primary Examiner*—Rodney McDonald
*Attorney, Agent, or Firm*—Thomason Moser & Patterson

[57] ABSTRACT

A sputtering apparatus includes a target that is sputtered to deposit a material layer on a substrate. A filtering member is disposed intermediate the substrate and target to prevent target material particles travelling perpendicular to the substrate from contacting the substrate. This filtering reduces the rate of deposition occurring on the surface of the substrate with respect to that occurring on the walls of any holes therein, and thereby increases the deposition layer forming on the wall of the hole with respect to that forming on the surface of the substrate and base of the hole.

21 Claims, 6 Drawing Sheets

SPUTTERING APPARATUS FOR IMPROVED STEP COVERAGE

This is a continuation of application Ser. No. 08/561,148 filed on Nov. 21, 1995, now abandoned, which is a continuation of application Ser. No. 08/241,057, filed May 11, 1994, now abandoned.

BACKGROUND OF THE INVENTION

The present invention relates to the deposition of useful material layers on substrates, including semiconductor substrates. More particularly, the present invention relates to the field of depositing useful layers on substrates and filling holes in the uppermost material layers previously formed on the substrate to create interconnects, plugs, or other structures within the multiple material layers ultimately formed on the substrate.

The formation of microelectronic circuitry on semiconductor substrates depends, in part, on the preparation of interconnects, plugs, or other such devices through, or between, the various layers formed on the substrate surface. These structures are typically created by depositing a film of conductive material over the uppermost dielectric material layer or layers on the substrate, such that a portion of the conductive deposition layer fills any holes in the dielectric material layer or layers previously formed on the substrate. One typical method of providing this conductive material layer is by sputtering a target to supply particles of target material that may deposit on the substrate.

Where sputtering is used to form a material layer on the base and walls of a hole, the thickness of the layer formed on the walls of the hole, known as the step coverage, is typically only a percentage of the thickness of the material layer that forms on the upper surface of the substrate. This occurs because the geometric configuration of a hole prevents a portion of the target material particles travelling in the direction of the wall of the hole from reaching the wall of the hole, whereas the generally flat upper surface of the substrate has no such limiting geometric configuration. Where the aspect ratio of the hole is high, i.e., the hole depth is large with respect to the hole width, the percentage of available target material particles that deposit on the wall of the hole varies with the depth of the hole. Typically, the step coverage is thicker at the upper regions of the hole as compared to the step coverage at the lower regions of the hole. Therefore, where the hole has a high aspect ratio, the base of the hole may have inadequate step coverage, or areas of no coverage, ultimately creating a defect in the device at that location on the substrate.

SUMMARY OF THE INVENTION

The present invention provides apparatus and methods for controlling the direction of the paths of the particles sputtered from a target and onto a substrate to increase the thickness of the layer deposited on the side walls of any holes or trenches in the uppermost layer or layers of the substrate relative to the thickness of the layer deposited on the uppermost surface of the substrate. To provide this increased side wall coverage, a filter member is disposed between the substrate and target, such that target material particles traveling in paths perpendicular to the surface of the substrate are filtered out of the stream of particles sputtered from the target before they reach the substrate.

The filter member reduces the rate of deposition on the upper surface of the substrate and base of any holes or trenches therein, but has minimal affect on the rate of deposition on the side walls of the holes or trenches. Therefore, sputtered target material particles will deposit on the walls of the holes or trenches at more nearly the same rate at which they deposit on the upper surface of the substrate. Thus, the thickness of the layer formed on the side walls of the hole will more nearly equal the thickness of the deposition layer formed on the base of the hole and the uppermost surface of the substrate.

In the preferred embodiment, the filter member of the invention includes a plurality of perforated plates disposed between the substrate and the target which prevent the target material particles travelling in paths perpendicular to the surface of the substrate from passing therethrough. By changing the size of the plates, and the orientation and size of the perforations therein, the direction of the target material particles that contact the substrate at each region on the substrate may be controlled.

BRIEF DESCRIPTION OF THE DRAWINGS

These and other features of the invention will become apparent from the following description when read in conjunction with the accompanying drawings, wherein.

DESCRIPTION OF THE EMBODIMENTS

Figure 1:
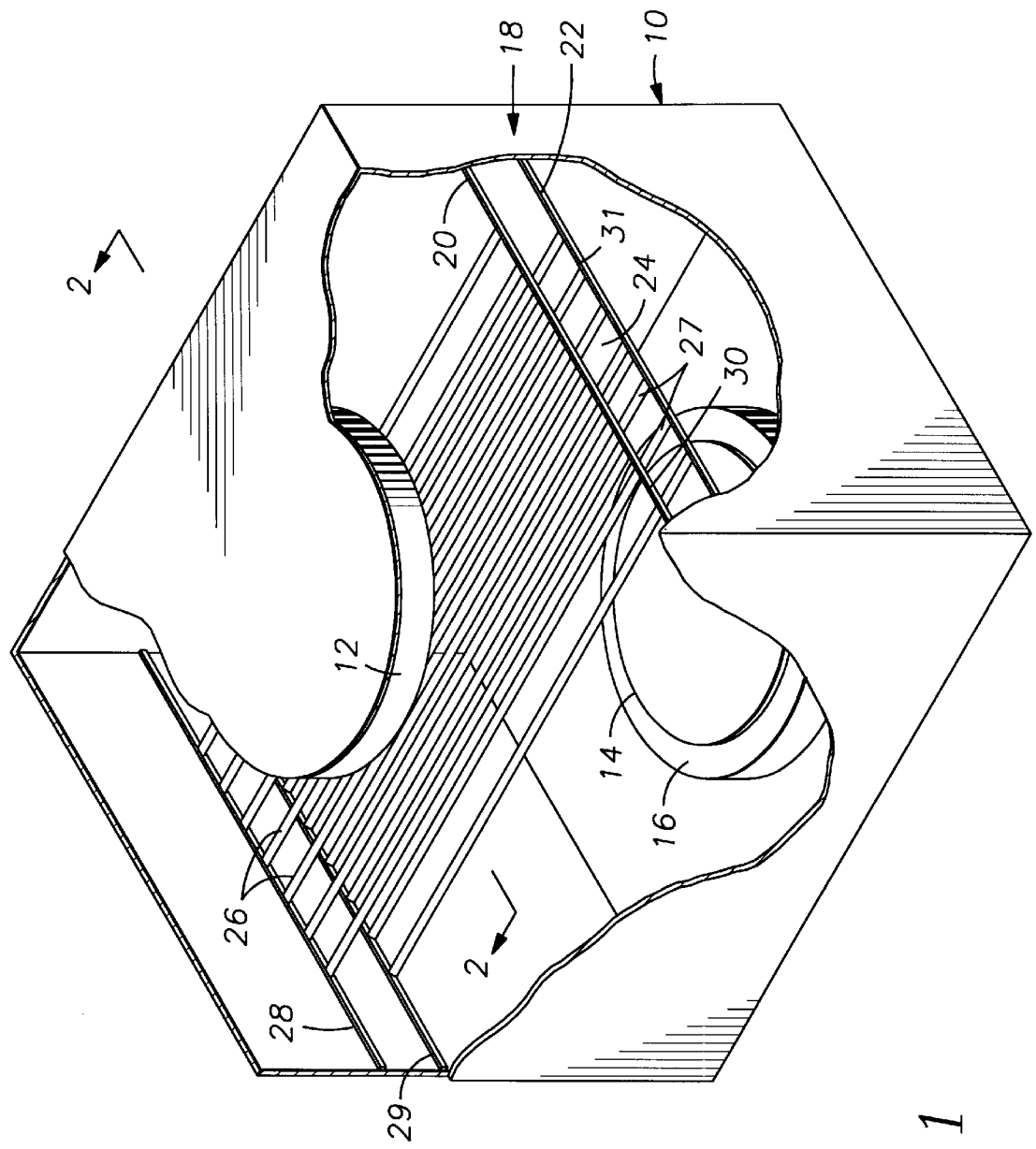
FIG. 1 is a partially cutaway perspective view of a simplified processing chamber of the present invention.

Referring to FIG. 1, the general configuration of the preferred embodiment of a processing chamber 10 for practicing the present invention is shown. The chamber 10 forms an enclosure having a sputtering target 12 attached to the top thereof and a substrate receiving pedestal 16 located on the base thereof. The face of the target 12 and of the pedestal 16 are maintained in a generally parallel relationship, such that target particles travelling in a path that is perpendicular to the target 12 will also be travelling in a path that is perpendicular to the pedestal 16. To form the material layer on the substrate 14, the substrate 14 is located on the pedestal 16 and the target 12 is sputtered to eject target material particles therefrom for deposition on the substrate 14. A grid 18 is disposed between the target 12 and the substrate 14 and is configured to filter out the target material particles travelling in paths that are substantially perpendicular to the substrate 14, but permit target material particles that are travelling in paths that are substantially transverse or oblique to the substrate 14 to pass therethrough. As a result of this configuration, the step coverage of holes, in particular of high aspect ratio holes, may be increased with respect to the thickness of the deposition layer formed on the uppermost surface of the substrate.

Referring still to FIG. 1, the preferred orientation and general structure of the perforated plates for selectively filtering target material particles is shown. The perforated plates preferably include a grid 18 formed from a first grid plate 20 and a second grid plate 22 spaced apart by a span 24. The perforated plates 20, 22 are preferably affixed to the wall of the processing chamber 10 or to shields disposed inwardly of the chamber wall. The first grid plate 20 includes a plurality of longitudinally extending bars 26 connected at their opposed ends to cross members 28, 30, and the second grid plate 22 includes a plurality of longitudinally extending bars 27 likewise connected at their opposed ends to cross members 29, 31. The bars 26, 27 are aligned, but staggered, to allow a portion of the target particles traveling obliquely with respect to the target 12 and substrate 14 to pass through the grid 18, but prevent any target material particles that are travelling perpendicularly to the target 12 or substrate 14 from passing through the grid 18.

Figure 2:
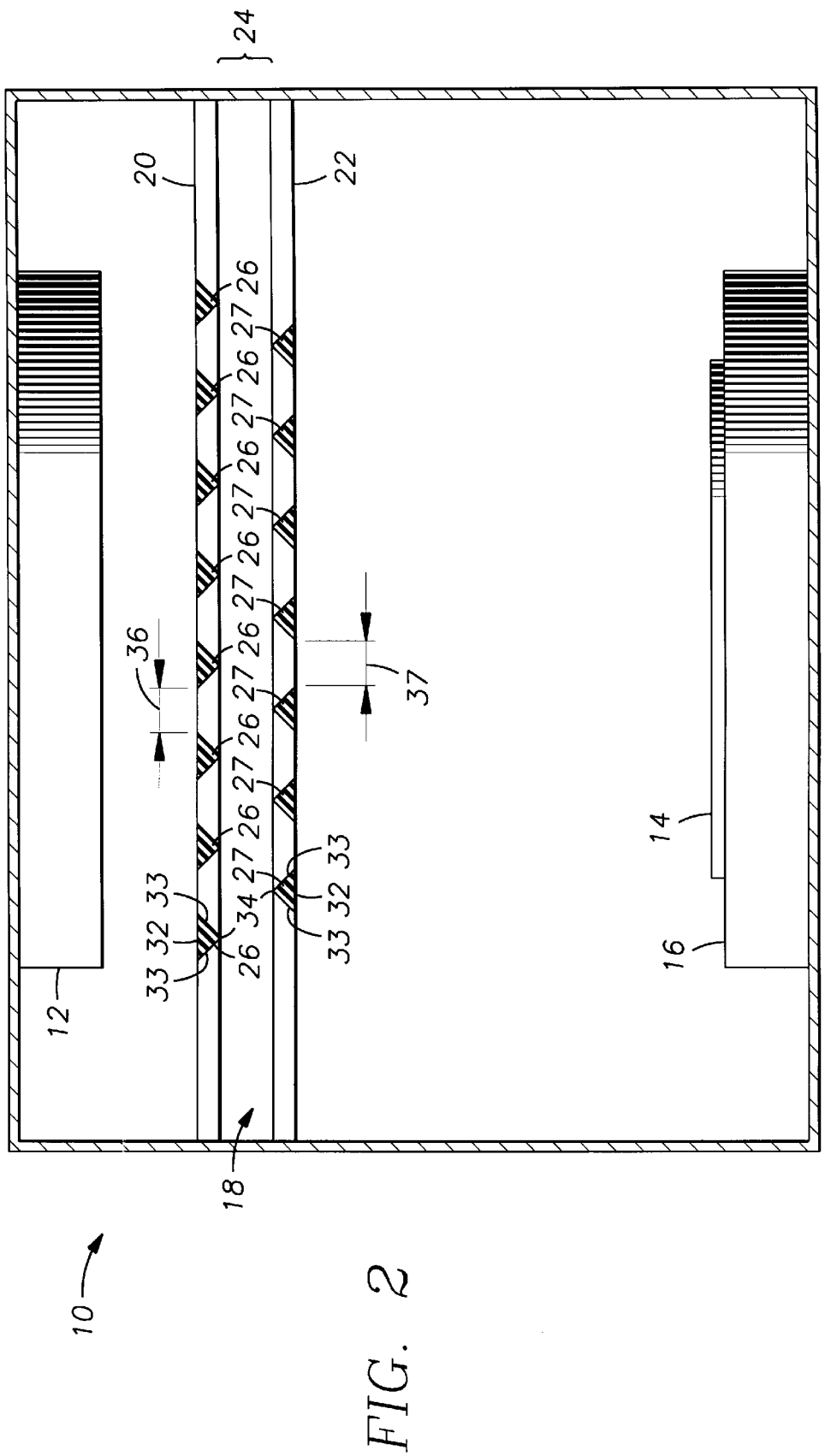
FIG. 2 is a sectional view of the simplified chamber of FIG. 1 at section 2—2.

Referring now to FIG. 2, one configuration of the bars 26, 27 necessary to provide the selective filtering of the target material particles is shown. In this embodiment, each of the longitudinally extending bars 26, 27 has a generally triangular profile defined by a base 32 having inwardly projecting sides 33 which terminate in a tip 34. The base 32 of each bar 26 on the first grid plate 20 is generally parallel to the base 32 of each other bar 26 on the grid plate 20, and the tips 34 of each of the bars 26 are disposed downwardly. Likewise, the base 32 of each bar 27 on the grid plate 22 is generally parallel to the base 32 of each other bar 27 on the second grid plate 22, but the tips 34 of each of the bars 27 are disposed upwardly. Each bar 26 in the first grid plate 20 is separated from the next bar 26 in the first grid plate 20 by a first grid gap 36, and each bar 27 in the second grid plate 22 is separated from the next bar 27 in the second grid plate 22 by a second grid gap 37. Further, the longitudinally extending bars 26 of the first grid plate 20 are disposed in a parallel offset position with respect to the longitudinally extending bars 27 in the second grid plate 22. In this configuration of the grid 18, a longitudinally extending bar 27 in the second grid plate 22 is disposed in vertical alignment with each of the first grid gaps 36 between the longitudinally extending bars 26 of the first grid plate 20, and a longitudinally extending bar 26 in the first grid plate 20 is disposed in vertical alignment with each of the second grid gaps 37 between the longitudinally extending bars 27 in the second grid plate 22. The alignment of the bars 26, 27 and gaps 36, 37 forms a barrier to target material particles travelling in a path perpendicular to the substrate, but permits a portion of the target material particles travelling transversely to the substrate 14 to pass through the grid gaps 36, 37 between the longitudinally extending bars 26 of the first grid plate 20 and the adjacent longitudinally extending bars 27 of the second grid plate 22 and deposit on the substrate 14.

Figure 3:
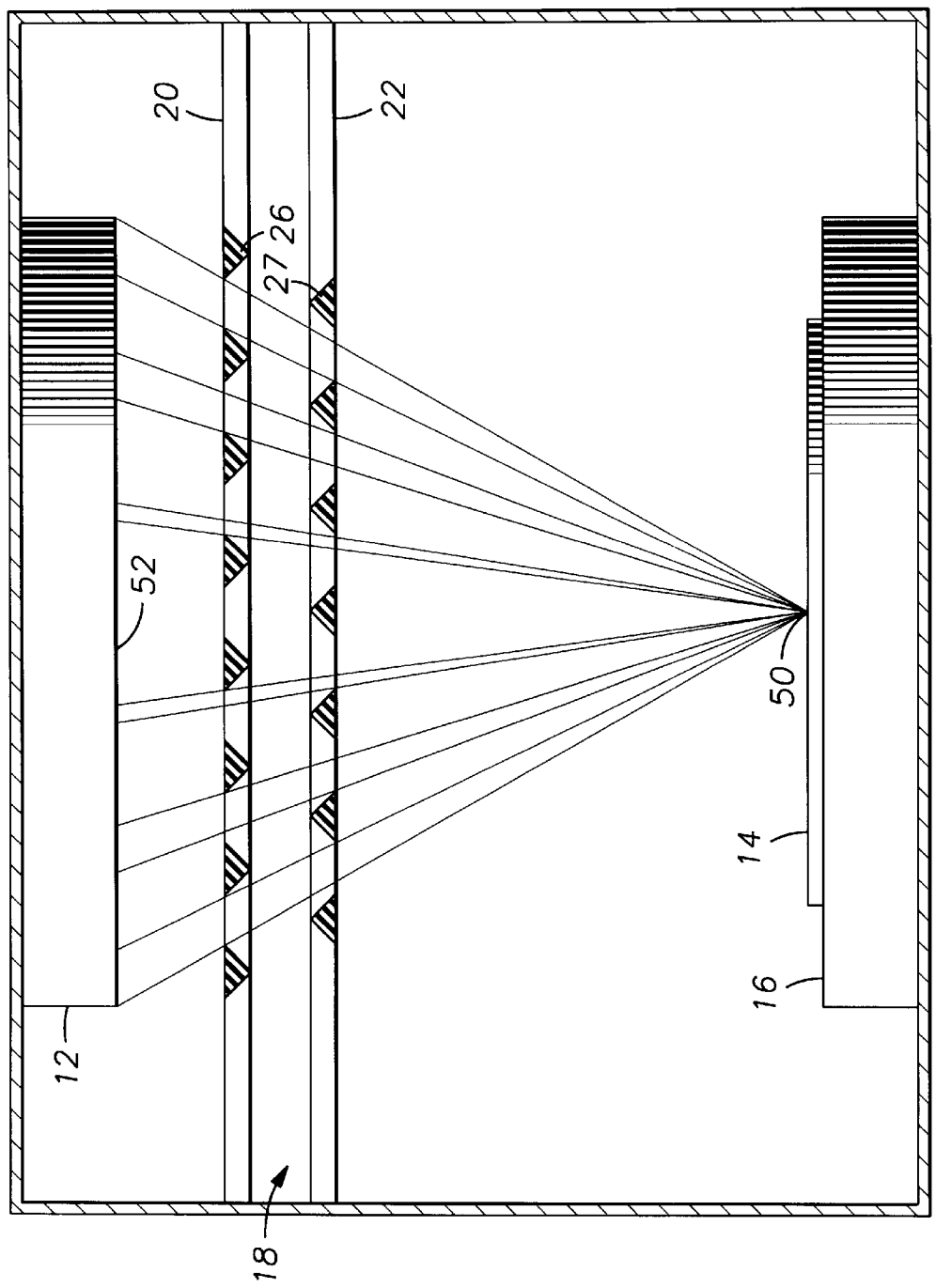
FIG. 3 is a sectional view of the simplified chamber of FIG. 1 at section 2—2, showing the distribution of target material particles depositing on the center of a substrate in the chamber.
Figure 4:
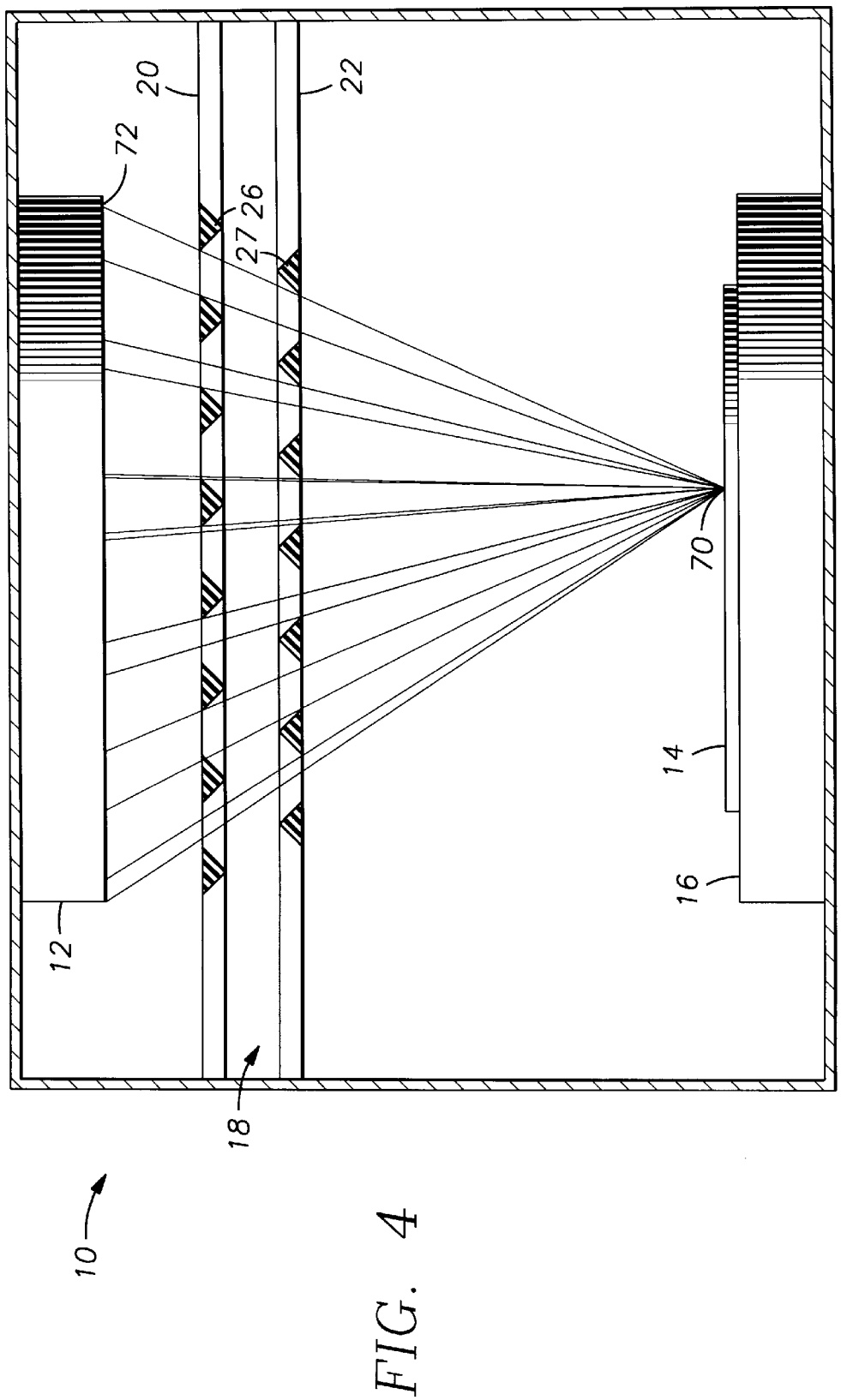
FIG. 4 is a sectional view of the simplified chamber of FIG. 1 at section 2—2, showing the distribution of target material particles depositing on an off-center location on substrate received in the chamber.
Figure 5:
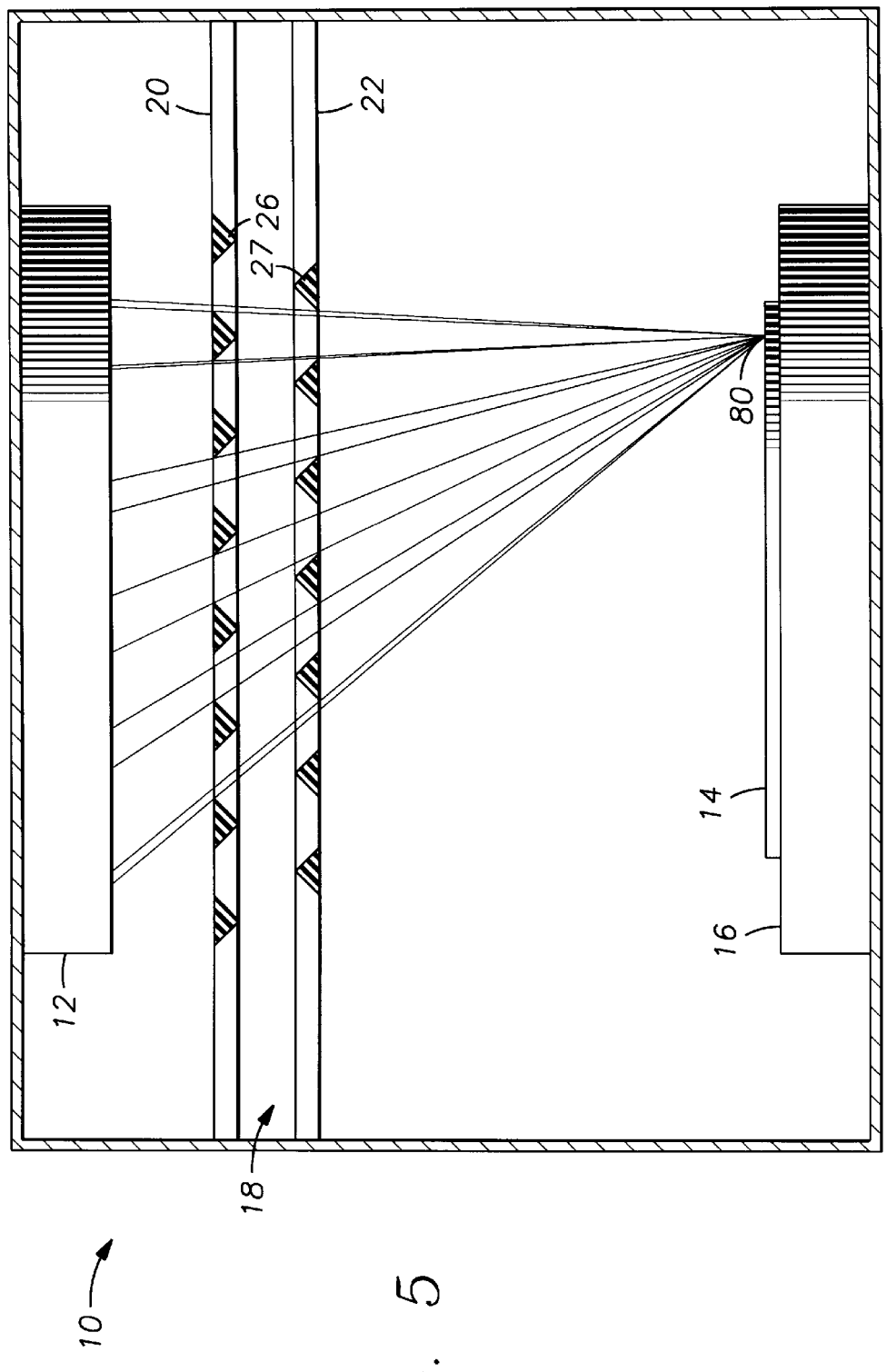
FIG. 5 is a sectional view of the simplified chamber of FIG. 1 at section 2—2, showing the distribution of target material particles depositing on an area adjacent the edge of a substrate received in the chamber.

Referring now to FIGS. 3, 4 and 5, the effect of the grid 18 on the distribution of the target material particles contacting the substrate 14 is shown. FIG. 3 shows the distribution of paths travelled by particles received at the center of the substrate 14. At a deposition location 50 at the center of the substrate 14, the grid 18 blocks the passage of target material particles travelling from a location 52 on the target 12 which is directly above the point 50 on the substrate 14, but allows a portion of the target material particles that are sputtered from locations on the target on either side of the location 52 to pass through the grid 18 and contact the point 50 on the substrate 14.

Referring now to FIG. 4, the effect of the grid 18 on the distribution in the directions of the target material particles depositing at an off-center point 70 on a substrate 14 is shown. Again, the location 72 on the target directly above the point 70 on the substrate 14 is blocked by the grid 18, and multiple locations spaced from the location 72 on the target 14 contribute target material particles to form a deposition layer at the point 70 on the substrate 14. At this off-center point 70, a slight majority of the target material particles contacting the substrate 14 are ejected from the opposite side of the target 12 as shown in FIG. 4.

FIG. 5 shows the effect of the grid on the distribution of the paths of the target particles depositing on a point 80 adjacent to an edge of the substrate 14. The grid 18 blocks the passage of target material particles travelling in a path perpendicular to the substrate 14 at the point 80, and nearly all of the target material particles depositing on the substrate 14 were emitted from the opposite side of the target 14, as shown in FIG. 5.

The configuration of the grid 18 may be modified to meet specific deposition requirements. By varying the size of the bars 26, 27 to adjust the sizes of the grid gaps 36 and/or 37, and/or varying the size of the span 24, and/or varying the size of the target 12 in relation to the size of the substrate 14, the quantity and paths of the target material particles reaching the substrate 14 may be controlled. Thus, if desired, each region on the substrate 14 may receive particles from one or more locations on the target 12, and the incident angles at which the target material particles contact the substrate 14 may be adjusted to maximize the step coverage of the holes being filled by the sputtering process. By reducing the width of the bars 26, 27 and the grid gaps 36, 37, the number of locations on the target 12 that contribute particles to each point on the substrate 14 is increased, which increases the uniformity of the deposition layer formed on the substrate 14 and in the hole. Preferably, the grid gaps 36, 37 should be much less than the mean free path for collisions between sputtered gas particles and the background gas atoms. Likewise, the distance between the grid 18 and the substrate 14 should be less than the mean free path for collisions between the sputtered gas particles and the background gas atoms so that a majority of the target material particles passing through the grid 18 do not change direction. However, the grid 18 should be positioned a sufficient distance from the substrate 14 to prevent shadowing on the substrate 14.

Figure 6:
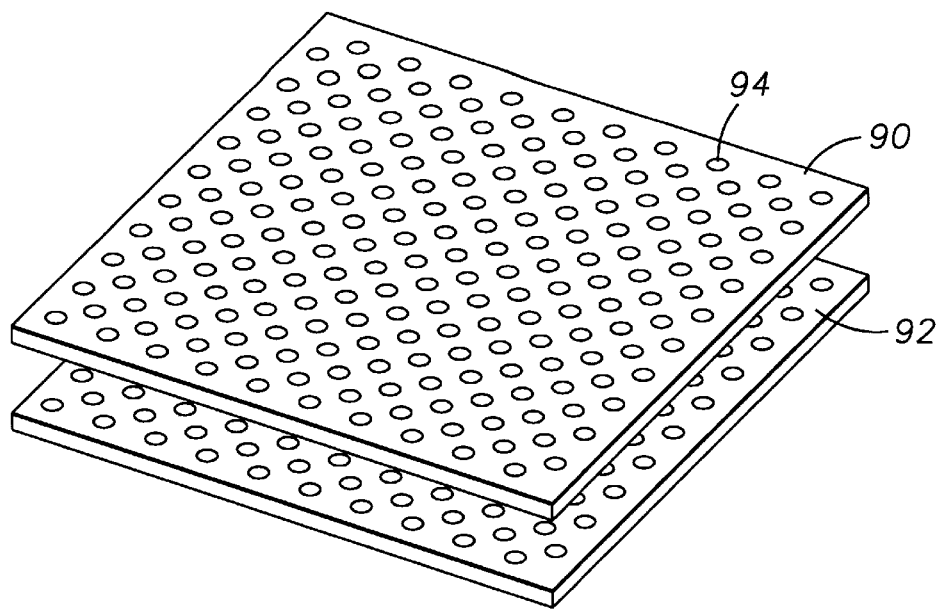
FIG. 6 is a perspective view of an alternative embodiment of the perforated plate of FIG. 1.
Figure 7:
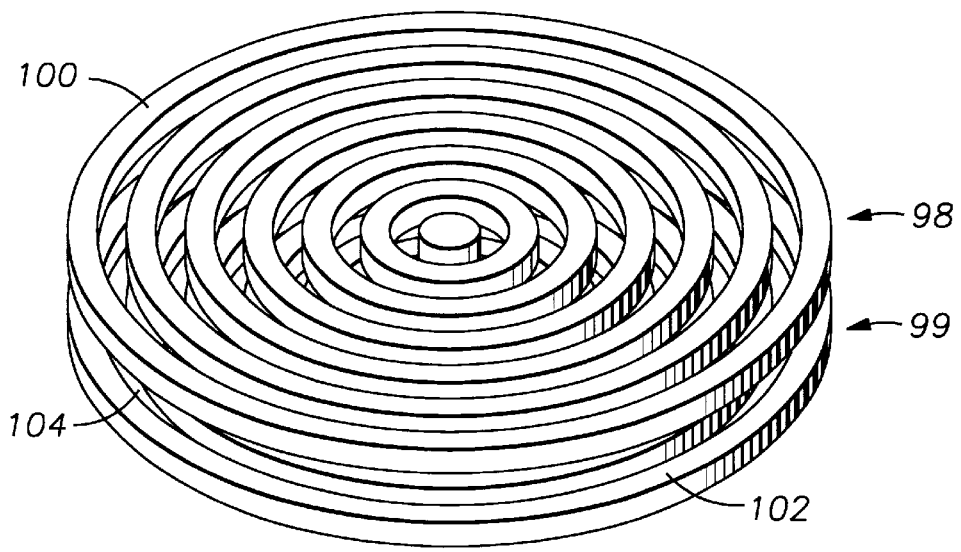
FIG. 7 is a perspective view of an additional alternative embodiment of the perforated plate of FIG. 1.

Although the plurality of perforated plates of the present invention have been described herein in terms of a grid 18 having a plurality of staggered longitudinally extending triangular bars 26, 27, the perforated plates may also be configured as a pair of plates 90, 92 having multiple staggered apertures 94 therethrough, as shown in FIG. 6, such that target material particles travelling in a path perpendicular to the substrate will deposit on one of the two plates 90, 92, but a portion of the particles travelling transversely to the plates may pass through the apertures 94 and deposit on the substrate 14. Additionally, the perforated plates may include a plurality of ring plates 98, 99 each of which include a plurality of concentric rings 100, 102 instead of the longitudinally extending bars 26, 27, as shown in FIG. 7. The rings 100 on one of the plates 98 align with the gaps 104 between the rings 102 on the other of the plates 99. Likewise, if the grid 18 is configured from multiple bars 26, 27, the bars 26, 27 may have shapes other than triangular. For example, the cross section of the bars 26, 27 may be rectangular, round, ellipsoid, ovoid, trapezoidal, or otherwise, and bars having different geometric cross sections may be combined to control the locations from which each region on the substrate 14 receives target material particles. Finally, although the invention has been described in terms of two perforated plates, the invention may be practiced with a greater number of perforated plates, or with multiple particle absorbing or blocking members which may be connected, or independently mounted, within the chamber.

We claim:

1. An apparatus for depositing target material particles sputtered from a target on a substrate, comprising:

a filter member disposed intermediate the substrate and the target, said filter member comprising a first surface having first openings and a second surface having second openings wherein the first and second openings are staggered for preventing the passage therethrough of most of the target material particles traveling in paths perpendicular to the substrate.

2. The apparatus of claim 1, wherein said filter member includes a plurality of perforated plates.

3. The apparatus of claim 2, wherein said perforated plates include a plurality of spaced bars.

4. The apparatus of claim 3, wherein said bars have a triangular cross section.

5. The apparatus of claim 3, wherein said perforated plates include a first perforated plate and a second perforated plate, and said bars in each of said first perforated plate and said second perforated plate are longitudinal and regularly spaced.

6. The apparatus of claim 5, wherein the spacing between said bars forms longitudinal gaps between said bars, and said bars of said first perforated plate are disposed in a parallel, offset relationship to said bars in said second perforated plate.

7. The apparatus of claim 6, wherein said bars in said first perforated plate are at least as wide as said longitudinal gaps between said bars in said second perforated plate.

8. The apparatus of claim 2, wherein said perforated plates include a plurality of concentric rings, having concentric gaps provided between said concentric rings; and said concentric gaps and said concentric rings are positioned to ensure that target material particles traveling through the plates in a path perpendicular to the substrate contact one of said rings in one of said perforated plates.

9. The apparatus of claim 3, wherein said perforated plates include a plurality of apertures therein, and said apertures are positioned in said perforated plates to ensure that target material particles travelling through said perforated plates in a path perpendicular to the substrate contact one of said perforated plates.

10. A method of providing a deposition on a substrate, comprising:

providing a sputtering chamber having at least a target, a substrate positioned on a substrate receiving pedestal therein, and a filter member disposed intermediate the substrate and the target, said filter member comprising a first surface having first openings and a second surface having second openings wherein the first and second openings are staggered;

sputtering the target to provide target material particles to provide a deposition layer on the substrate; and selectively filtering most of the target material particles traveling in paths perpendicular to the substrate from the target material particles sputtered from the target.

11. The method of claim 10, wherein said selectively filtering the target material particles is performed by providing a filter member intermediate the target and the substrate.

12. The method of claim 11, wherein the filter member includes a plurality of perforated plates.

13. The method of claim 12, wherein the perforated plates include a plurality of staggered apertures therethrough.

14. The method of claim 12, wherein the perforated plates include at least a first and a second plate, and each of the first and second plates includes a plurality of spaced, longitudinal bars.

15. The method of claim 14, wherein a gap is formed between each pair of adjacent spaced longitudinal bars, and a bar in the first plate is disposed in alignment with each gap in the second plate.

16. The method of claim 12, wherein each perforated plate includes a plurality of concentric rings therein.

17. An apparatus for controlling the paths of target material particles sputtered from a target and contacting a substrate, comprising:

a filter member disposed intermediate the substrate and the target, said filter member having at least a first plate and a second plate having a plurality of spaced bars, wherein the spacing between said bars forms a longitudinal gap between said bars and said bars of said first plate are disposed in a parallel, offset relationship to said bars in said second plate.

18. The apparatus of claim 17, wherein said bars have a triangular cross section.

19. The apparatus of claim 17, wherein said bars in said first plate are at least as wide as said gaps between said bars in said second plate.

20. An apparatus for depositing target material particles sputtered from a target on a substrate comprising:

a first plate;

a second plate; and said plates include a plurality of concentric rings having concentric gaps provided between said concentric rings; and said concentric gaps and said concentric rings are positioned to ensure that target material particles traveling through the plates in a path perpendicular to the substrate contact one of said rings in one of said plates.

21. An apparatus for depositing target material particles sputtered from a target on a substrate, comprising:

a first plate;

a second plate; and wherein said plates include a plurality of apertures therein, and said apertures are staggered in said plates to ensure that target material particles traveling through said plates in a path perpendicular to the substrate contact one of said plates.

* * * * *